United States Patent
Ha Woo et al.

(10) Patent No.: US 9,362,248 B2
(45) Date of Patent: Jun. 7, 2016

(54) CORELESS PACKAGE STRUCTURE AND METHOD FOR MANUFACTURING SAME

(71) Applicant: Zhen Ding Technology Co., Ltd., Tayuan, Taoyuan (TW)

(72) Inventors: Yong Ha Woo, Kwang myung (KR); E-Tung Chou, Taoyuan (TW); Wen-Lun Lo, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/331,330

(22) Filed: Jul. 15, 2014

(65) Prior Publication Data

US 2015/0014849 A1 Jan. 15, 2015

(30) Foreign Application Priority Data

Jul. 15, 2013 (CN) .......................... 2013 1 0294203

(51) Int. Cl.

| H01L 21/00 | (2006.01) |
| H01L 23/00 | (2006.01) |
| H01L 23/31 | (2006.01) |
| H01L 21/56 | (2006.01) |
| H05K 1/18 | (2006.01) |
| H05K 3/00 | (2006.01) |
| H05K 3/46 | (2006.01) |

(52) U.S. Cl.
CPC ............ *H01L 24/24* (2013.01); *H01L 23/3121* (2013.01); *H01L 24/19* (2013.01); *H01L 24/82* (2013.01); *H01L 24/97* (2013.01); *H01L 21/561* (2013.01); *H01L 21/568* (2013.01); *H01L 24/32* (2013.01); *H01L 24/73* (2013.01); *H01L 24/92* (2013.01); *H01L 2224/04105* (2013.01); *H01L 2224/24227* (2013.01); *H01L 2224/24247* (2013.01); *H01L 2224/32225* (2013.01); *H01L 2224/32245* (2013.01); *H01L 2224/73267* (2013.01); *H01L 2224/82039* (2013.01); *H01L 2224/92244* (2013.01); *H01L 2224/97* (2013.01); *H01L 2924/12042* (2013.01); *H01L 2924/181* (2013.01); *H01L 2924/1815* (2013.01); *H01L 2924/18162* (2013.01); *H05K 1/185* (2013.01); *H05K 3/0097* (2013.01); *H05K 3/4682* (2013.01); *H05K 2203/1536* (2013.01)

(58) Field of Classification Search
None
See application file for complete search history.

(56) References Cited

U.S. PATENT DOCUMENTS

| 8,372,666 B2 * | 2/2013 | Crawford | ............ H01L 21/6835 438/15 |
| 2011/0215464 A1 * | 9/2011 | Guzek | ................... H01L 21/568 257/737 |
| 2012/0139095 A1 * | 6/2012 | Manusharow | .......... H01L 23/36 257/690 |

(Continued)

FOREIGN PATENT DOCUMENTS

TW 201131734 A 9/2011

*Primary Examiner* — Sonya D McCall Shepard
(74) *Attorney, Agent, or Firm* — Novak Druce Connolly Bove + Quigg LLP

(57) ABSTRACT

A coreless package structure and a method for manufacturing same includes the steps of providing a supporting substrate comprising an etching resist layer and a copper foil. A groove is defined in the copper foil and a plurality of contact pads are formed on the surface of the copper foil. A chip including a plurality of electrode pads is received in the groove and a packaging layer is formed on a side of the copper foil. An insulating layer and a conductive pattern layer are formed on the packaging layer in that order, the conductive pattern layer being electrically connected to the contact pads and the electrode pads by a plurality of conductive bumps. Finally, the etching resist layer and the copper foil are removed to obtain a coreless package structure.

16 Claims, 23 Drawing Sheets

(56) References Cited

U.S. PATENT DOCUMENTS

| | | | | |
|---|---|---|---|---|
| 2012/0161316 A1* | 6/2012 | Gonzalez | ............ | H01L 21/568 257/738 |
| 2014/0093999 A1* | 4/2014 | Teh | ...................... | H01L 21/568 438/107 |
| 2014/0376195 A1* | 12/2014 | Zhang | .................. | H05K 3/4682 361/748 |

* cited by examiner

CORELESS PACKAGE STRUCTURE AND METHOD FOR MANUFACTURING SAME

FIELD

The present disclosure relates to the manufacture of electronic devices.

BACKGROUND

To accommodate development of miniaturized electronic products with multiple functions, coreless package structures with embedded components are widely used.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
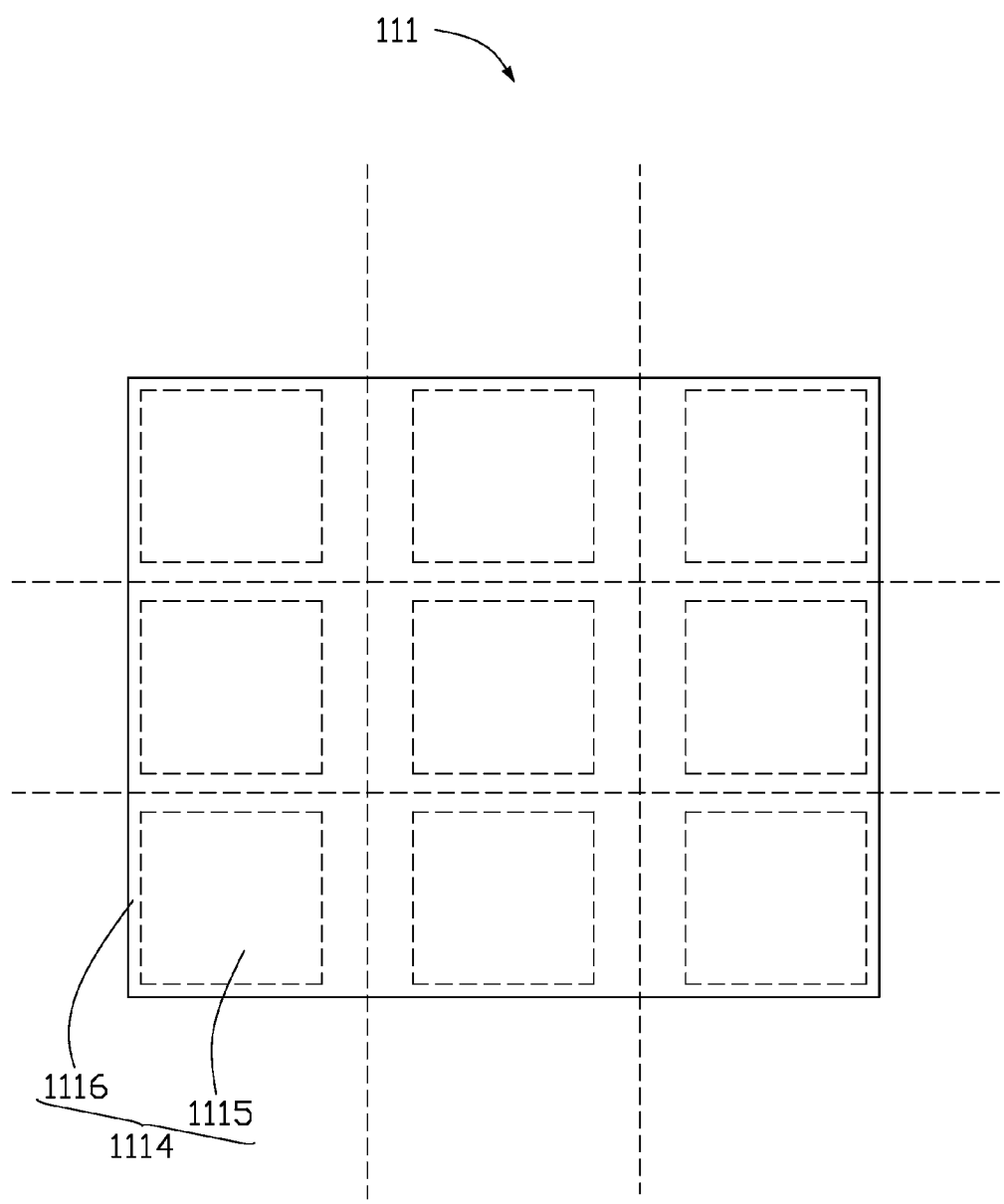
FIG. 1 is a top view of a first embodiment of a supporting substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIGS. 1-21 illustrate a first embodiment of a method for manufacturing coreless package structures 100.

Figure 2:
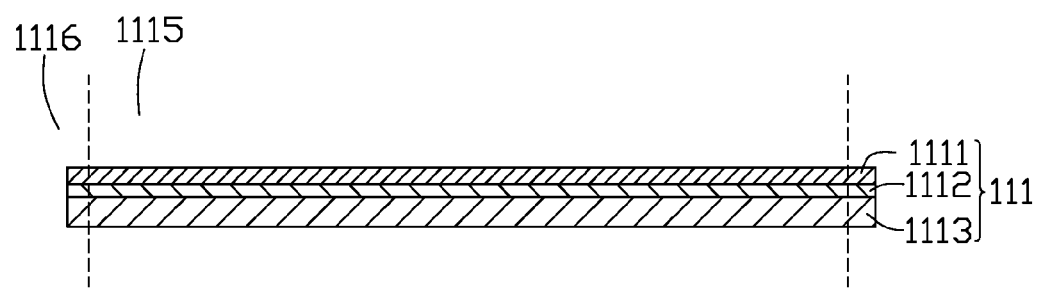
FIG. 2 is a cross-sectional view of a unit of the supporting substrate of FIG. 1, the supporting substrate including a first copper foil, a supporting layer, and an etching resist layer.

Referring to FIGS. 1-2, a supporting substrate 111 is provided. The supporting substrate 111 includes a supporting layer 1111, an etching resist layer 1112, and a first copper foil 1113. The etching resist layer 1112 is located between the supporting layer and the first copper foil 1113. The supporting layer 1111 can be made of copper, aluminum, or other metals. The etching resist layer 1112 can be made of nickel. In other embodiments, the supporting layer 1111 and the etching resist layer 1112 can also be made of non-metallic materials.

The supporting substrate 111 can include a plurality of substrate units 1114 (see representative areas divided by broken lines in FIG. 1). Each of the substrate units 1114 are configured to support a coreless package structure. Each of the substrate units 1114 include a product area 1115 and an annular area 1116 surrounding the product area 1115. The coreless package structures supported on each substrate unit 1114 can be identical and manufactured together. In following steps, the processes applied to only one of the substrate units 1114 is described.

Figure 3:
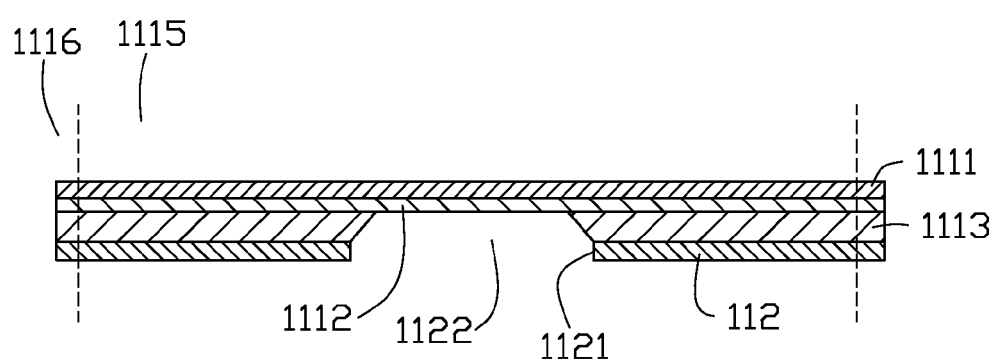
FIG. 3 shows a cross-sectional view of a photo resist film formed on the first copper foil in FIG. 2, and a groove defined in the first copper foil by an etching process.
Figure 4:
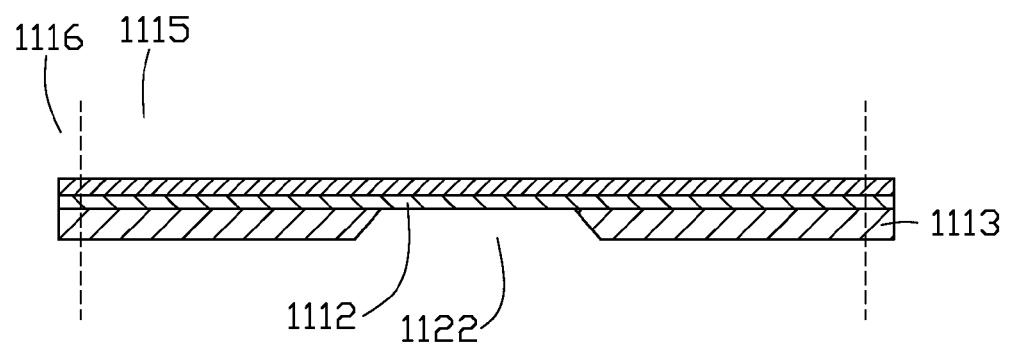
FIG. 4 shows a cross-sectional view of the photo resist film in FIG. 1 being removed.

Referring to FIGS. 3-4, a groove 1122 is defined in the first copper foil 1113 by an etching process. The groove 1122 can be manufactured by the following steps. First, a first photo resisting film 112 is formed on a surface of the first copper foil 1113. The first photo resisting film 112 defines a through hole 1121. A portion of the first copper foil 1113 is exposed from the through hole 1121 of the first photo resisting film 112. Second, the first copper foil 1113 exposed from the first photo resisting film 112 is removed by the etching process to form the groove 1122. The groove 1122 is passed through the first copper foil 1113, thus a portion of the etching resist layer 1112 is exposed in the groove 1122. Lastly, the first photo resisting film 112 is removed.

Figure 5:
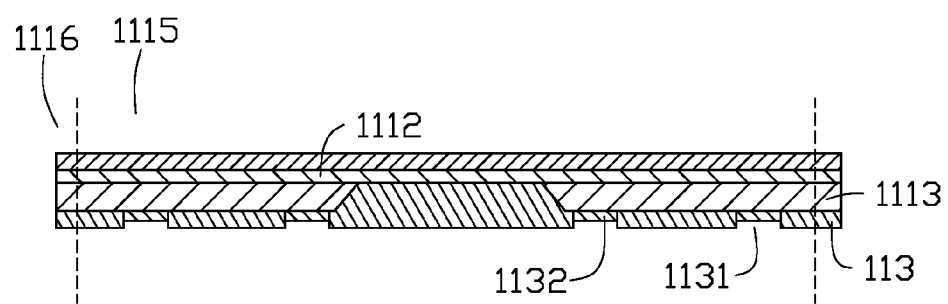
FIG. 5 shows a cross-sectional view of a first plating resisting film formed on the first copper foil in FIG. 4, and a plurality of contact pads formed on the portions of the first copper foil exposed from the first plating resisting film.
Figure 6:
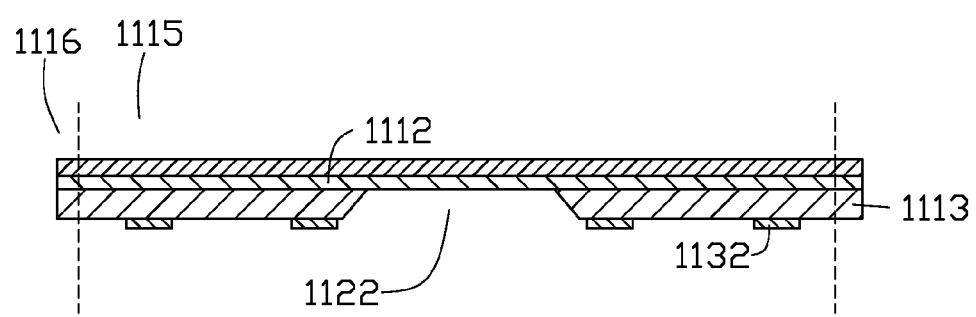
FIG. 6 shows a cross-sectional view of the first plating resisting film in FIG. 5 being removed.

Referring to FIGS. 5-6, a plurality of contact pads 1132 are formed on the surface of the first copper foil 1113 in the product area 1115. The contact pads 1132 can be manufactured by the following steps. First, a first plating resisting film 113 is formed on the surface of the first copper foil 1113 and on a surface of the etching resist layer 1112 exposed in the groove 1122. The first plating resisting film 113 defines a plurality of first openings 1131. Portions of the first copper foil 1113 are exposed in the first openings 1131. Second, a plurality of contact pads 1132 are formed on the surface of the first copper foil 1113 exposed from the first plating resisting film 113 by an electroplating process. Finally, the first plating resisting film 113 is removed.

Figure 7:
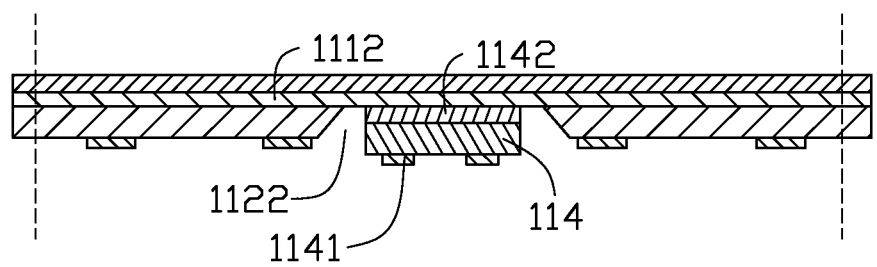
FIG. 7 shows a cross-sectional view of a chip received in the groove in FIG. 6.

Referring to FIG. 7, a chip 114 is received in the groove 1122. The chip 114 can be fixed on a surface of the etching resist layer 1112, exposed in the groove 1122, by an adhesive layer 1142. The chip 114 includes a plurality of electrode pads 1141 on a side away from the etching resist layer 1112.

Figure 8:
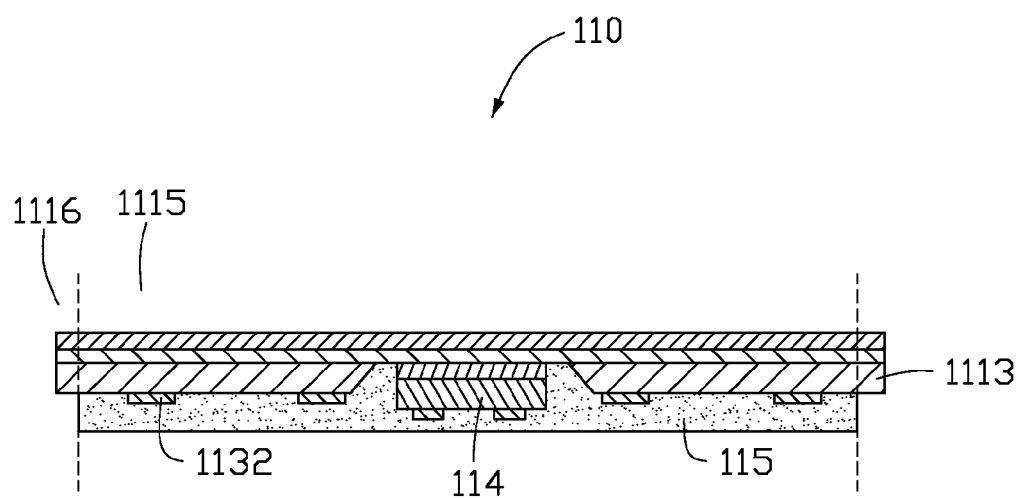
FIG. 8 shows a cross-sectional view of a packaging layer formed on the first copper foil to cover the chip and the contact pads in FIG. 7.

Referring to FIG. 8, a packaging layer 115 is formed on a side of the first copper foil 1113 in the product area 1115 to obtain a package substrate 110. The packaging layer 115 covers and adheres to the chip 114, the contact pads 1132, the etching resist layer 1112 exposed from the groove 1122, and the first copper foil 1113 exposed from the contact pads 1132 in the product area 1115. The packaging layer 115 can be formed by a molding process or a laminating process. In this embodiment, the packaging layer 115 is made of an epoxy, and is formed by a molding process.

Figure 9:
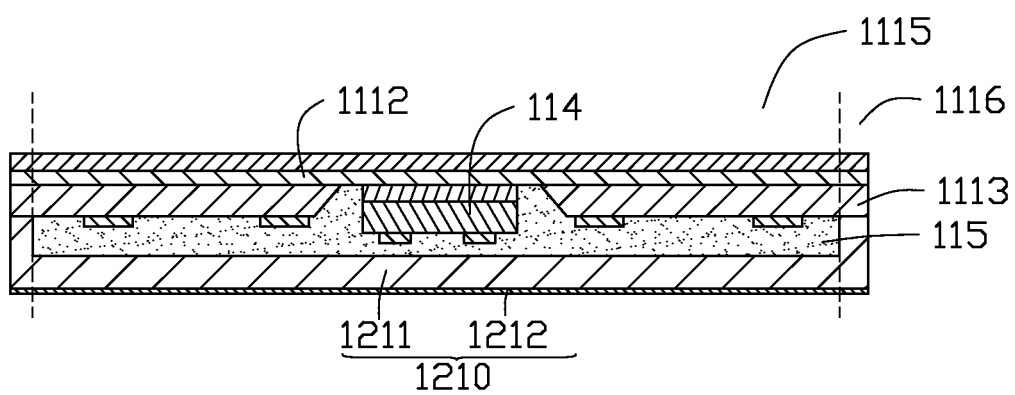
FIG. 9 shows a cross-sectional view of a first laminating substrate formed on the packaging layer in FIG. 8, the first laminating substrate including a first insulating layer.

Referring to FIG. 9, a first laminating substrate 1210 is laminated on a side of the packaging layer 115 away from the supporting substrate 111. The first laminating substrate 1210 includes a first insulating layer 1211 and a second copper foil 1212. The first insulating layer 1211 is located and adhered between the packaging layer 115 and the second copper foil 1212, and covers and adheres to the first copper foil 1113 in an annular area 1116.

Figure 10:
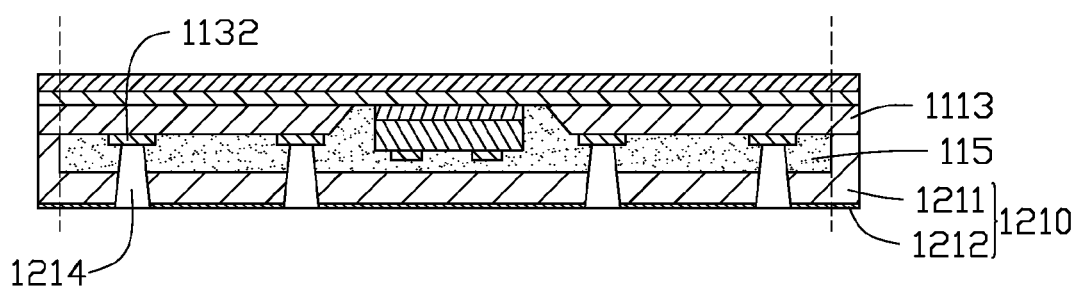
FIG. 10 shows a cross-sectional view of a plurality of first blind holes formed in the first laminating substrate in FIG. 9.
Figure 11:
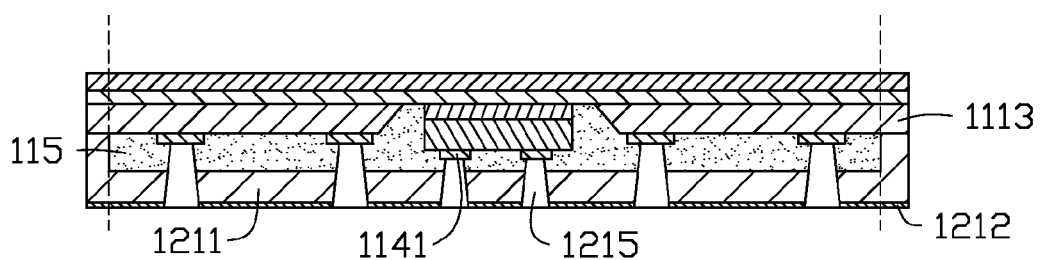
FIG. 11 shows a cross-sectional view of a plurality of second blind holes formed in the first laminating substrate in FIG. 10.

Referring to FIGS. 10-11, a plurality of first blind holes 1214 and a plurality of second blind holes 1215 are defined by the second copper foil 1212, the first insulating layer 1211, and the packaging layer 115. Each of the contact pads 1132 corresponds to, and is exposed from, one of the first blind holes 1214. Each of the electrode pads 1141 corresponds to, and is exposed from, one of the second blind holes 1215. The first blind holes 1214 and the second blind holes 1215 can be separately formed by laser drilling processes. In this embodiment, the first blind holes 1214 and the second blind holes 1215 are manufactured by an ultraviolet (UV) laser drilling process.

Figure 12:
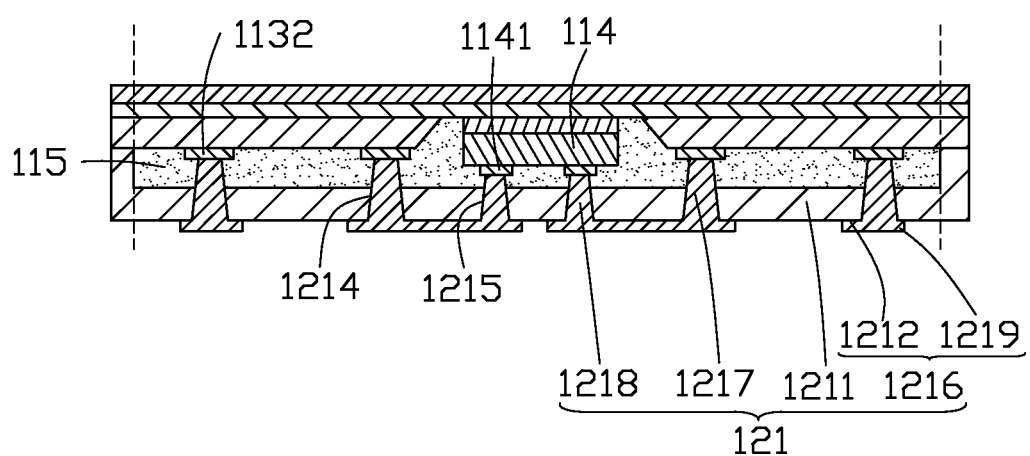
FIG. 12 shows a cross-sectional view of a conductive bumps formed in the blind holes in FIG. 11, and a first inner conductive pattern layer formed on the first insulating layer in FIG. 11.

Referring to FIG. 12, a plurality of first conductive bumps 1217, a plurality of second conductive bumps 1218, and a first inner conductive pattern layer 1216 are formed by an electroless plating process and then an electro plating process. A first laminating structure 121 formed on a side of the package substrate 111 is obtained. Each of the first conductive bumps 1217 is formed in one of the first blind holes 1214, and corresponds to, and is electrically connected to, one of the contact pads 1132. Each of the second conductive bumps 1218 are formed in one of the second blind holes 1215, and corresponds to, and is electrically connected to, one of the electrode pads 1141. The first inner conductive pattern layer 1216 is located on a surface of the first insulating layer 1211 away from the chip 114. The first inner conductive pattern layer 1216 is electrically connected to the contact pads 1132 by the first conductive bumps 1217. The first inner conductive pattern layer 1216 is electrically connected to the electrode pads 1141 by the second conductive bumps 1218.

In this embodiment, the first conductive bumps 1217, the second conductive bumps 1218, and the first inner conductive pattern layer 1216 are manufactured by the following steps. First, a second plating resist layer (not shown) is formed on a side of the second copper foil 1212. The first blind holes 1214, the second blind holes 1215, and a portion of the second copper foil 1212 are exposed from the second plating resist layer. Second, the first conductive bumps 1217, the second conductive bumps 1218, and a conductive layer 1219 are formed by an electroless plating process and then by an electroplating process. The conductive layer 1219 is electrically connected to the first conductive bumps 1217 and the second conductive bumps 1218. Third, the second plating resist layer is removed. Lastly, a first inner conductive pattern layer 1216 is formed by etching a portion of the second copper foil 1212 exposed from the conductive layer 1219.

In other embodiments, the first laminating substrate 1210 can only include a first insulating layer 1211.

Figure 13:
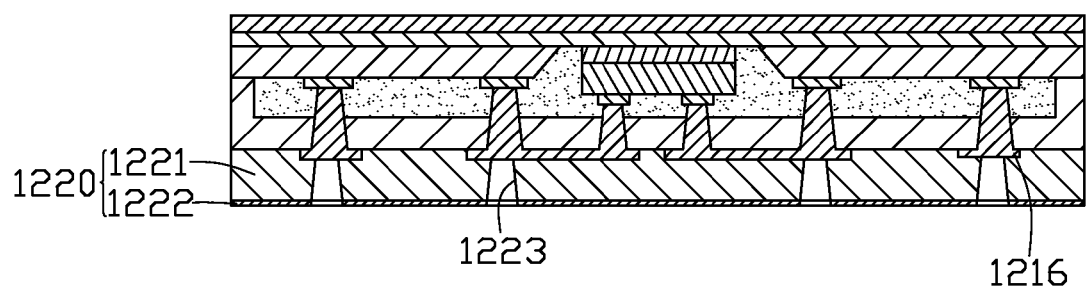
FIG. 13 shows a cross-sectional view of a second laminating substrate formed on the first inner conductive pattern layer in FIG. 12 and a plurality of third blind holes formed in the second laminating substrate, the second laminating substrate including a second insulating layer.

Referring to FIG. 13, a second laminating substrate 1220 is laminated on a side of the first inner conductive pattern layer 1216 away from the supporting substrate 111, and the second laminating substrate 1220 defines a plurality of third blind holes 1223. The second laminating substrate 1220 includes a second insulating layer 1221 and a third copper foil 1222. The second insulating layer 1221 is adhesively located between the first inner conductive pattern layer 1216 and the third copper foil 1222. The third blind holes 1223 pass through the third copper foil 1222 and the second insulating layer 1221. In this embodiment, the third blind holes 1223 are formed by an ultraviolet (UV) laser drilling process. Portions of the first inner conductive pattern layer 1216 are exposed from the third blind holes 1223.

Figure 14:
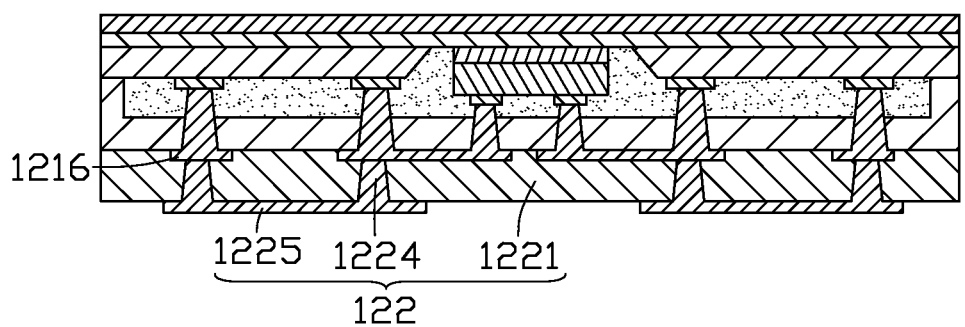
FIG. 14 shows a cross-sectional view of conductive bumps formed in the third blind holes in FIG. 13, and a second inner conductive pattern layer formed on the second insulating layer in FIG. 13.

Referring to FIG. 14, a plurality of third conductive bumps 1224, and a second inner conductive pattern layer 1225 are formed. A second laminating structure 122 formed on a side of the first laminating structure 121 is obtained. Each of the third conductive bumps 1224 is formed in one of the third blind holes 1223. The second inner conductive pattern layer 1225 is located on a surface of the second insulating layer 1221. The second inner conductive pattern layer 1225 is electrically connected to the first inner conductive pattern layer 1216 by the third conductive bumps 1224. Methods for forming the third conductive bumps 1224 and the second inner conductive pattern layer 1225 are similar to the methods for forming the conductive bumps 1217 and the first inner conductive pattern layer 1216.

In other embodiments, the first blind holes 1214, the second blind holes 1215, and the third blind holes 1223 can be manufactured by a carbon dioxide laser drilling process. Before the carbon dioxide laser drilling process is begun, portions of the copper foil can be removed by an etching process to expose portions of the insulating layers, the exposed portions of the insulating layers correspond to the blind holes.

Figure 15:
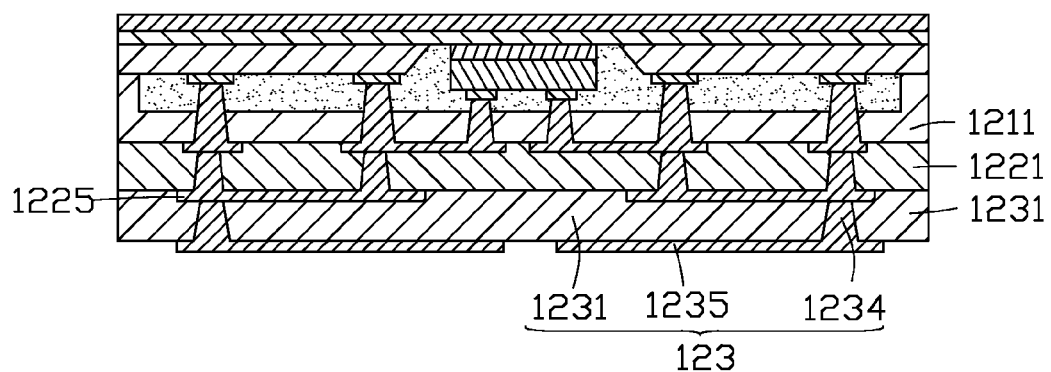
FIG. 15 shows a cross-sectional view of a third laminating structure formed on the second inner conductive pattern layer in FIG. 14, the third laminating structure including an outer conductive pattern layer.

Referring to FIG. 15, a third laminating structure 123 is laminated on a side of the second laminating structure 122 by a method similar to the method of forming the second laminating structure 122. The third laminating structure 123 includes a third insulating layer 1231, an outer conductive pattern layer 1235, and a plurality of fourth conductive bumps 1234. The outer conductive pattern layer 1235 is laminated to the third insulating layer 1231 on a side of the third insulating layer 1231 away from the second inner conductive pattern layer 1225. The outer conductive pattern layer 1235 is electrically connected to the second inner conductive pattern layer 1225 by the fourth conductive bumps 1234.

In other embodiments, the number of the laminating structures is not limited to 3, but can be 1, 2, or more than 3.

Figure 16:
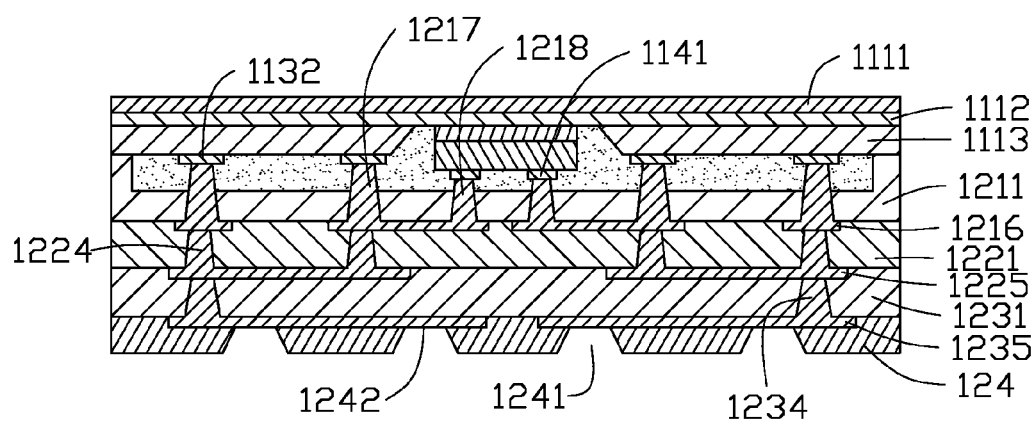
FIG. 16 shows a cross-sectional view of a solder resist layer formed on the outer conductive pattern layer in FIG. 15.

Referring to FIG. 16, a solder resist layer 124 is formed on the outer conductive pattern layer 1235 and a portion of the third insulating layer 1231 exposed from the outer conductive pattern layer 1235. A plurality of openings 1241 are defined in the solder resist layer 124, and portions of the outer conductive pattern layer 1235 are exposed from the solder resist layer 124. The exposed portions of the outer conductive pattern layer 1235 are defined to be soldering pads 1242. In other embodiments, protective films (not shown) can be formed on the surface of the soldering pads 1242 by a plating process, or by an organic solderability preservative process.

Figure 17:
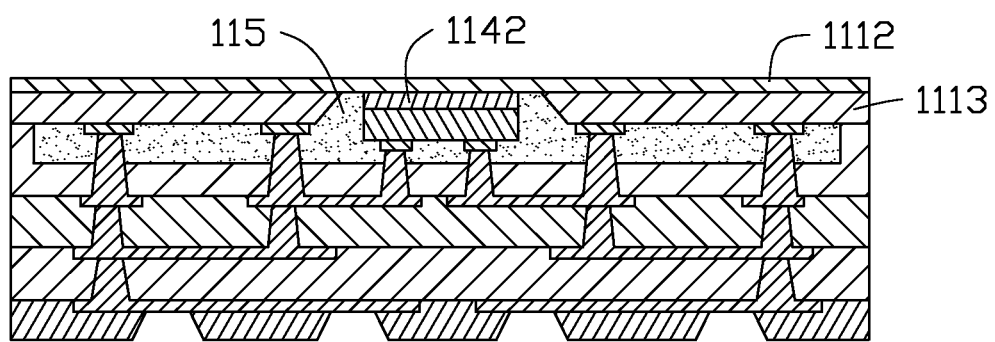
FIG. 17 shows a cross-sectional view of the supporting layer of the supporting substrate in FIG. 16 being removed.

Referring to FIG. 17, the supporting layer 1111 is removed by an etching process to expose the etching resist layer 1112.

Figure 18:
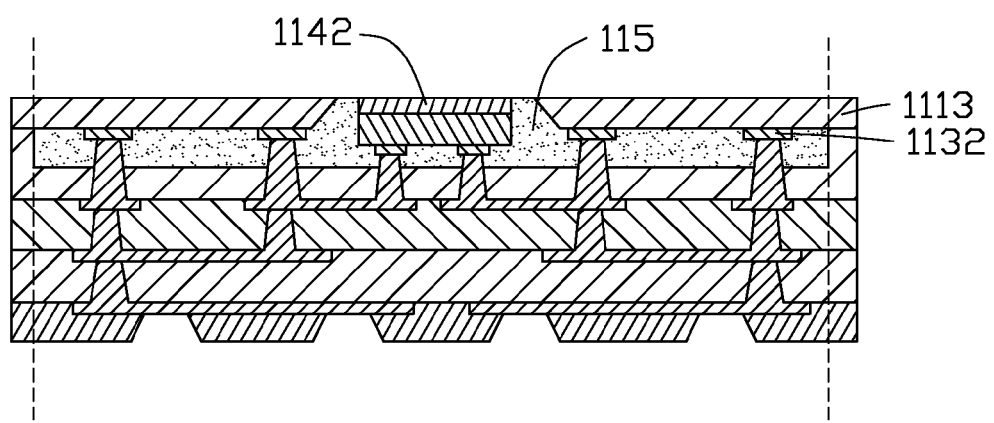
FIG. 18 shows a cross-sectional view of the etching resist layer of the supporting substrate in FIG. 17 being removed.

Referring to FIG. 18, the etching resist layer 1112 is removed by an etching process to expose the first copper foil 1113, a portion of the packaging layer 115, and the adhesive layer 1142.

Figure 19:
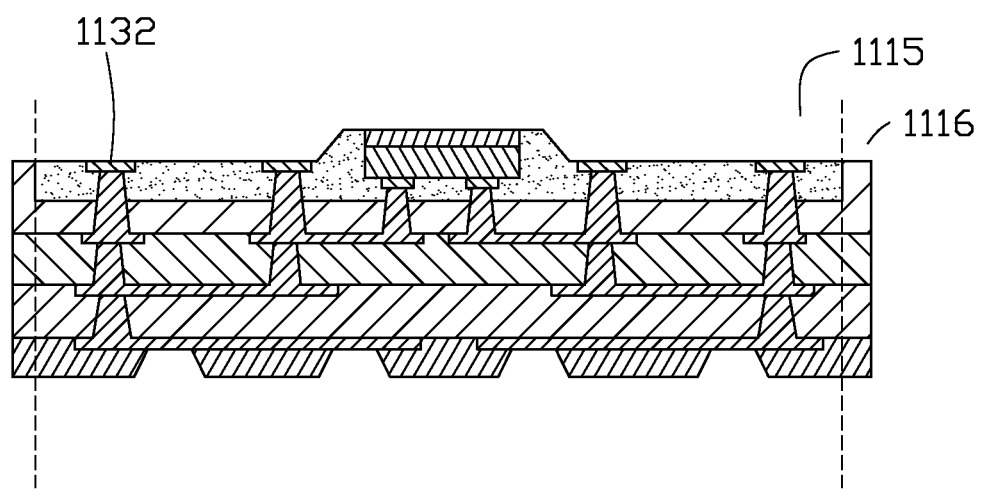
FIG. 19 shows cross-sectional view of the first copper foil of the supporting substrate in FIG. 18 being removed.

Referring to FIG. 19, the first copper foil 1113 is removed by an etching process to expose the contact pads 1132.

Figure 20:
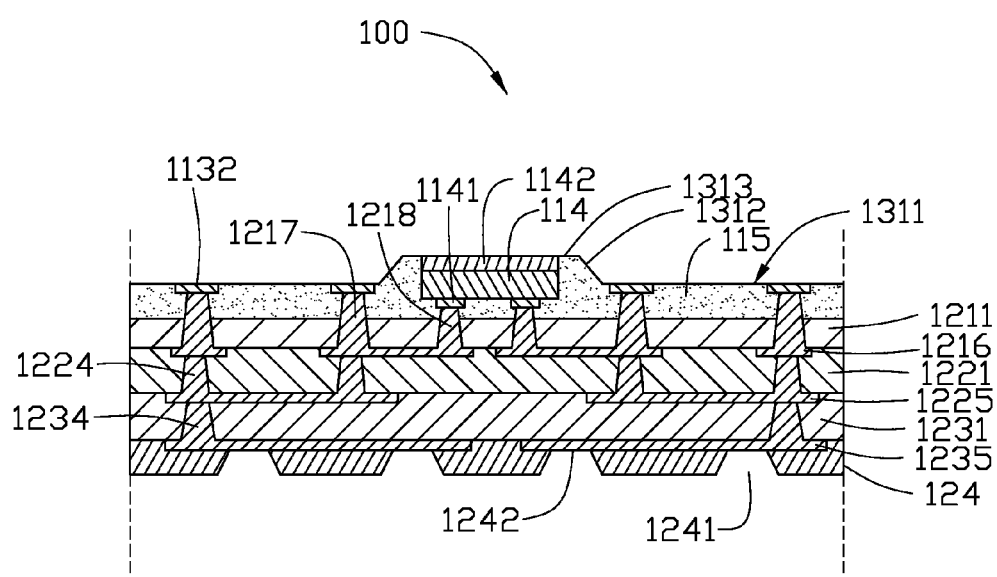
FIG. 20 shows a cross-sectional view of an annular area in FIG. 19 being removed to obtain a coreless package structure.

Referring to FIG. 20, the annular area 1116 is removed by a cutting process along the borders of the annular area 1116 and the product area 1115. A coreless package structure 100 is obtained.

The coreless package structure 100 includes a packaging layer 115, a first insulating layer 1211 laminated with the packaging layer 115, a plurality of contact pads 1132, a first inner conductive pattern layer 1216, a plurality of first conductive bumps 1217, a plurality of second conductive bumps 1218, an adhesive layer 1142, and a chip 114. The first inner conductive pattern layer 1216 is formed on a surface of the first insulating layer 1211 away from the packaging layer 115. The packaging layer 115 includes a first surface 1311 away from the first inner conductive pattern layer 1216. A protruding portion 1312 projects from the first surface 1311. The protruding portion 1312 includes a second surface 1313 coplanar with the first surface 1311. The contact pads 1132 are formed from the first surface 1311 leading into an interior of the packaging layer 115. The surfaces of the contact pads 1132 away from the first inner conductive pattern layer 1216 are coplanar with the first surface 1311, and the contact pads 1132 are thus exposed from the packaging layer 115. The adhesive layer 1142 is formed from the second surface 1313 leading into an interior of the packaging layer 115. The surface of the adhesive layer 1142 away from the first inner conductive pattern layer 1216 is coplanar with the second surface 1313. The chip 114 is embedded in the packaging layer 115 and at least a portion of the chip 114 is embedded in the protruding portion 1312 of the packaging layer 115. The chip 114 includes two opposite sides. One side of the chip 114 is in contact with the adhesive layer 1142. Another side of the chip 114 includes a plurality of electrode pads 1141. The first inner conductive pattern layer 1216 is electrically connected to the contact pads 1131 by the first conductive bumps 1217.

The first inner conductive pattern layer 1216 is electrically connected to the electrode pads 1141 by the second conductive bumps 1218.

The coreless package structure 100 further includes, in order, a second insulating layer 1221, a second inner conductive pattern layer 1225, a third insulating layer 1231, an outer conductive pattern layer 1235, and a solder resist layer 124 on a side of the first inner conductive pattern layer 1216 away from the packaging layer 115. The second inner conductive pattern layer 1225 is electrically connected to the first inner conductive pattern layer 1216 by a plurality of third conductive bumps 1224. The outer conductive pattern layer 1235 is electrically connected to the second inner conductive pattern layer 1225 by a plurality of fourth conductive bumps 1234. A plurality of openings 1241 is defined in the solder resist layer 124, and portions of the outer conductive pattern layer 1235 are exposed from the solder resist layer 124. The exposed portions of the outer conductive pattern layer 1235 are defined to be soldering pads 1242.

In other embodiments, a plurality of solder balls (not shown) can be formed on the contact pads 1132 and the soldering pads 1142.

In other embodiments, the supporting layer 1111 can be omitted.

In other embodiments, the electrode pads 1141 can be electrically connected to the contact pads 1132 by wires (not shown) by a wire bonding process, and the second blind holes 1215 and the second conductive bumps 1218 can thus be omitted.

Figure 21:
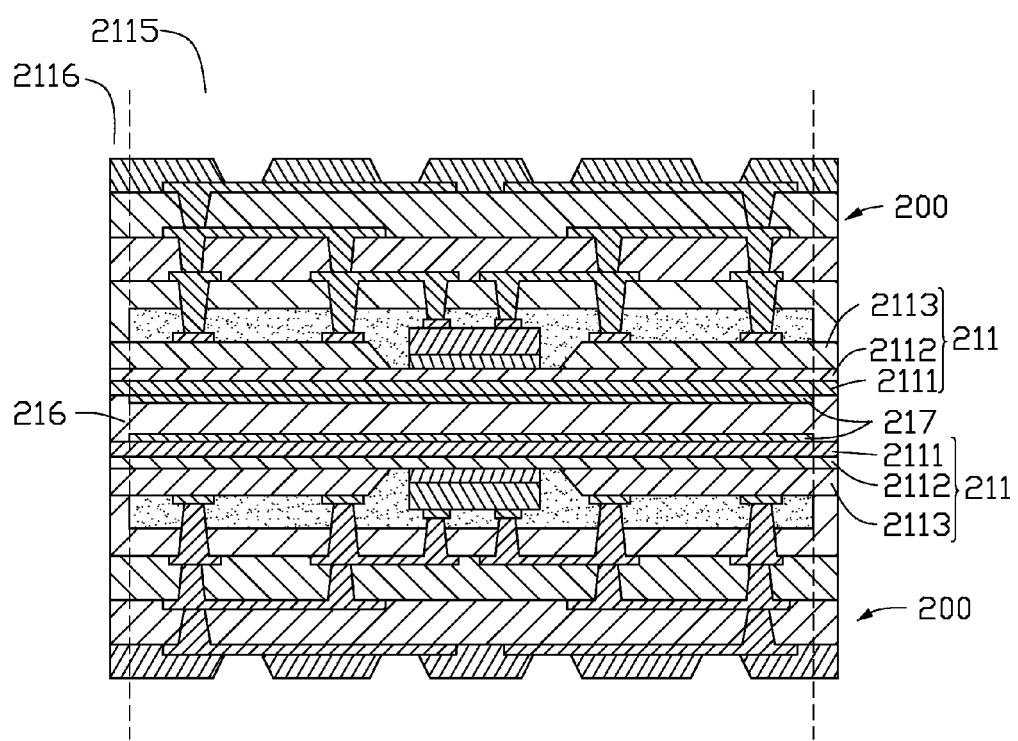
FIG. 21 shows a cross-sectional view of a schematic view of a second exemplary embodiment of two coreless package structures formed on two supporting substrates of the present disclosure, the two supporting substrates being bonded on two opposite sides of a bonding sheet, and a copper sheet located between one of the supporting substrates and the bonding sheet.
Figure 22:
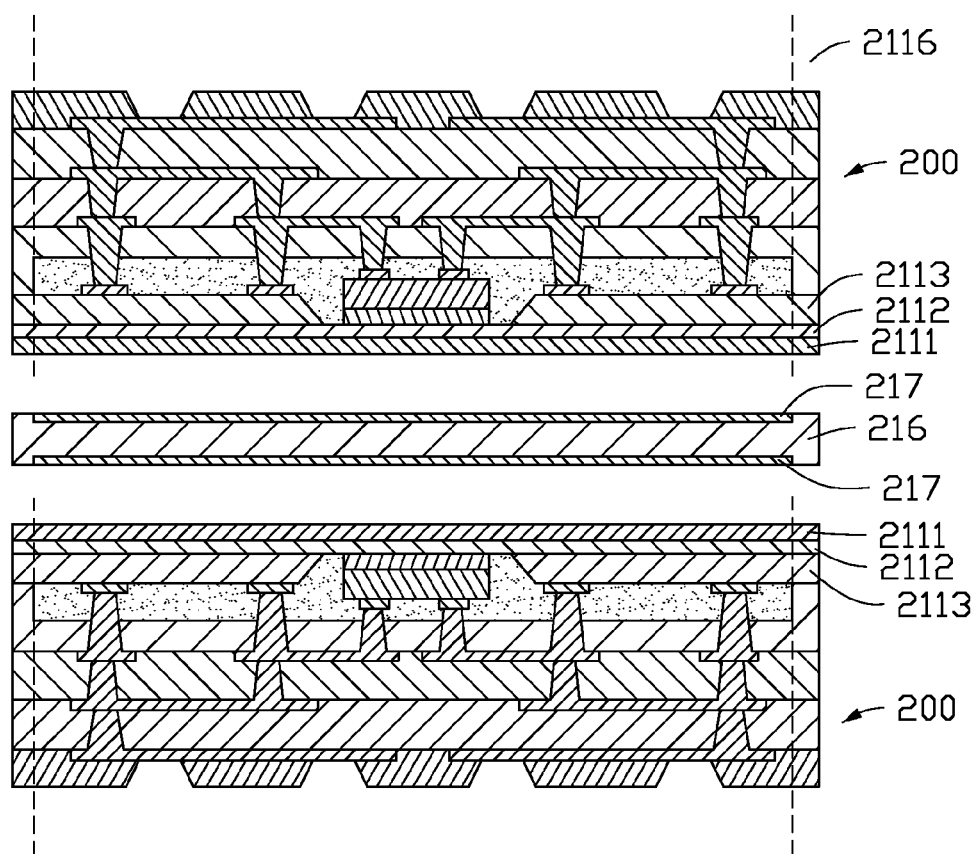
FIG. 22 shows a cross-sectional view of the supporting substrates and the bonding sheet in FIG. 21 being removed.
Figure 23:
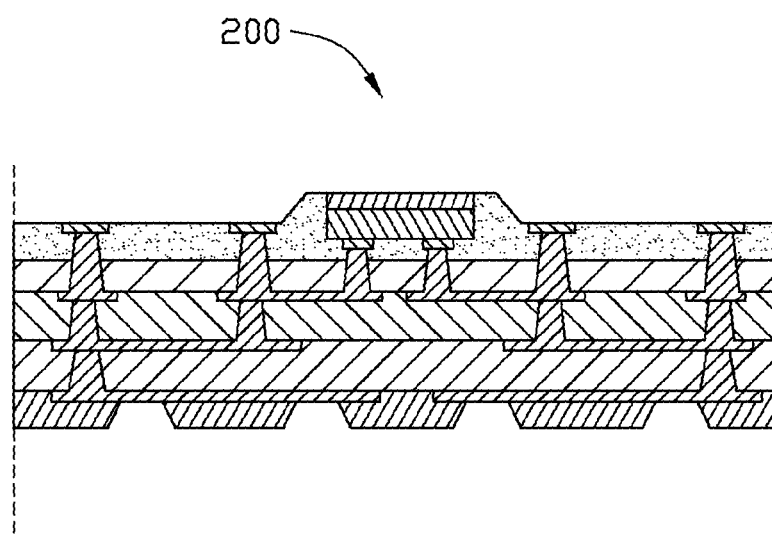
FIG. 23 shows a cross-sectional view of the supporting substrates being removed to obtain two coreless package structures.

FIGS. 21-23 show a second embodiment of a method for manufacturing coreless package structure 200. The method of the second embodiment is similar to the method of the first embodiment. The differences between the first embodiment and the second embodiment include the following.

The first difference is that, referring to FIG. 21, two supporting substrates 211, a bonding sheet 216, and two copper sheets 217 are provided. The two copper sheets 217 are bonded on either side of the bonding sheet 216. The sizes of the two copper sheets 217 are smaller than that of the bonding sheet 216. The two copper sheets 217 are bonded on middle areas of the bonding sheet 216. Each of the two supporting substrates 211 faces one of the copper sheets 217 and is adhered to the bonding sheet 216 at the edges thereof. Then, in the manner of the first embodiment, the two supporting substrates 211 can be etched together to form grooves, and two coreless package structures 200 supported by the supporting substrates 211 can be formed together.

The second difference is that, referring to FIGS. 22-23, after the two coreless package structures 200 are formed on the two supporting substrates 211, the bonding sheet 216 and the two copper sheets 217 are removed. Then, the supporting layer 1111, the etching resist layer 1112, and the first copper foil 1113 are removed. Thereafter, annular areas 2116 are removed by a cutting process along borders of the copper sheets 217 to obtain two coreless package structures 200.

In other embodiments, after the two coreless package structures 200 are formed on the two supporting substrates 211, the bonding sheet 216, the two copper sheets 217, and the annular areas 2116 can be removed together by a cutting process along borders of the copper sheets 217. Then, the supporting layer 1111, the etching resist layer 1112, and the first copper foil 1113 can be removed to obtain two coreless package structures 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a coreless package structure comprising:
    providing a supporting substrate comprising an etching resist layer and a first copper foil;
    defining a groove in the first copper foil;
    forming a plurality of contact pads on a surface of the first copper foil;
    receiving a chip in the groove, the chip comprising a plurality of electrode pads on a side away from the etching resist layer;
    forming a packaging layer on a side of the first copper foil, the packaging layer covering the chip, the contact pads, and the first copper foil exposed from the contact pads;
    forming an insulating layer, a plurality of first conductive bumps, and a conductive pattern layer, the insulating layer adhered between the packaging layer and the conductive pattern layer, the conductive pattern layer electrically connected to the contact pads by the first conductive bumps, the conductive pattern layer electrically connected to the electrode pads by a plurality of second conductive bumps; and
    removing the etching resist layer and the first copper foil, thereby, obtaining a coreless package structure;
    wherein a method for forming the insulating layer, the first conductive bumps, the second conductive bumps, and the conductive pattern layer comprises:
    laminating a first laminating substrate on a side of the packaging layer away from the supporting substrate, the first laminating substrate comprising an insulating layer and a second copper foil, the insulating layer adhered between the packaging layer and the second copper foil;
    forming a plurality of first blind holes and a plurality of second blind holes defined by the second copper foil, the insulating layer, and the packaging layer by a laser drilling process, each of the contact pads corresponding to and exposed from one of the first blind holes, and each of the electrode pads corresponding to and exposed from one of the second blind holes;
    forming the first conductive bumps, the second conductive bumps, and a conductive layer by an electroless plating process and then an electro plating process, each of the first conductive bumps being formed in one of the first blind holes, and corresponding to and electrically connected to one of the contact pads, each of the second conductive bumps being formed in one of the second blind holes, and corresponding to and electrically connected to one of the electrode pads, the conductive layer covering a portion of the second copper foil, the conductive layer being electrically connected to the first conductive bumps and the second conductive bumps; and
    etching a portion of the second copper foil exposed from the conductive layer to obtain the conductive pattern layer.

2. The method of claim 1, wherein the etching resist layer is made of nickel, and the etching resist layer and the first copper foil are removed by etching processes.

3. The method of claim 1, wherein the supporting substrate further comprises a supporting layer, the supporting layer is located on a side of the etching resist layer away from the first copper foil, the supporting layer is removed before the etching resist layer and the first copper foil being removed.

4. The method of claim 1, wherein the groove passes through the first copper foil, and a portion of the etching resist layer is exposed in the groove, a method for forming the groove comprises:
    forming a photo resisting film on a surface of the first copper foil away from the etching resist layer, the first photo resisting film defining a through hole, a portion of the first copper foil being exposed from the through hole;
    removing the portion of the first copper foil exposed from the through hole by an etching process, thereby, the groove being formed; and
    removing the photo resisting film.

5. The method of claim 4, wherein the chip is fixed on a surface of the etching resist layer exposed in the groove by an adhesive layer.

6. The method of claim 1, wherein a method for forming the contact pads comprises:
    forming a plating resisting film on a surface of the first copper foil away from the etching resist layer and a surface of the etching resist layer exposed in the groove, the plating resisting film defining a plurality of openings, portions of the first copper foil are exposed in the first openings;
    forming the contact pads on surfaces of the first copper foil exposed in the first openings by an electroplating process; and
    removing the plating resisting film.

7. The method of claim 1, wherein the packaging layer is made of an epoxy, and is formed by a molding process.

8. The method of claim 1, after forming the insulating layer, the first conductive bumps, and the conductive pattern layer, and before removing the etching resist layer and the first copper foil, further comprising forming at least one laminating structure on the surface of the conductive pattern layer away from the insulating layer.

9. A method for manufacturing a coreless package structure, comprising:
    providing two supporting substrates comprising an etching resist layer and a first copper foil, a bonding sheet, and two copper sheets, the two copper sheets being bonded on either side of the bonding sheet, each of the two supporting substrates facing to one of the copper sheets and being adhered to the bonding sheets;
    defining a groove in each one of the first copper foils;
    forming a plurality of contact pads on a surface of each one of the first copper foils;
    receiving a chip in each one of the grooves, the chip comprising a plurality of electrode pads on a side away from the etching resist layer;
    forming a packaging layer on a side of each one of the first copper foils, the packaging layer covering the chip, the contact pads, and the first copper foil exposed from the contact pads;
    forming an insulating layer, a plurality of first conductive bumps, and a conductive pattern layer on a surface of each one of the packaging layer, the insulating layer adhered between the packaging layer and the conductive pattern layer, the conductive pattern layer electrically connected to the contact pads by the first conductive bumps, the conductive pattern layer electrically connected to the electrode pads by a plurality of second conductive bumps; and removing the bonding sheet, the two copper sheets, the etching resist layers and the first copper foils, thereby, obtaining two coreless package structures;

wherein a method for forming the insulating layer, the first conductive bumps, the second conductive bumps, and the conductive pattern layer comprises:

laminating a first laminating substrate on a side of the packaging layer away from the supporting substrate, the first laminating substrate comprising an insulating layer and a second copper foil, the insulating layer adhered between the packaging layer and the second copper foil;

forming a plurality of first blind holes and a plurality of second blind holes defined by the second copper foil, the insulating layer, and the packaging layer by a laser drilling process, each of the contact pads corresponding to and exposed from one of the first blind holes, and each of the electrode pads corresponding to and exposed from one of the second blind holes;

forming the first conductive bumps, the second conductive bumps, and a conductive layer by an electroless plating process and then an electro plating process, each of the first conductive bumps being formed in one of the first blind holes, and corresponding to and electrically connected to one of the contact pads, each of the second conductive bumps being formed in one of the second blind holes, and corresponding to and electrically connected to one of the electrode pads, the conductive layer covering a portion of the second copper foil, the conductive layer being electrically connected to the first conductive bumps and the second conductive bumps; and etching a portion of the second copper foil exposed from the conductive layer to obtain the conductive pattern layer.

10. The method of claim 9, wherein the etching resist layer is made of nickel, and the etching resist layer and the first copper foil are removed by etching processes.

11. The method of claim 9, wherein the supporting substrate further comprises a supporting layer, the supporting layer is located on a side of the etching resist layer away from the first copper foil, the supporting layer is removed before the etching resist layer and the first copper foil being removed.

12. The method of claim 9, wherein the groove passes through the first copper foil, and a portion of the etching resist layer is exposed in the groove, a method for forming the groove comprises:

forming a photo resisting film on a surface of the first copper foil away from the etching resist layer, the first photo resisting film defining a through hole, a portion of the first copper foil being exposed from the through hole;

removing the portion of the first copper foil exposed from the through hole by an etching process, thereby, the groove being formed; and removing the photo resisting film.

13. The method of claim 12, wherein the chip is fixed on a surface of the etching resist layer exposed in the groove by an adhesive layer.

14. The method of claim 9, wherein a method for forming the contact pads comprises:

forming a plating resisting film on a surface of the first copper foil away from the etching resist layer and a surface of the etching resist layer exposed in the groove, the plating resisting film defining a plurality of openings, portions of the first copper foil are exposed in the first openings;

forming the contact pads on surfaces of the first copper foil exposed in the first openings by an electroplating process; and removing the plating resisting film.

15. The method of claim 9, wherein the packaging layer is made of an epoxy, and is formed by a molding process.

16. The method of claim 9, after forming the insulating layer, the first conductive bumps, and the conductive pattern layer, and before removing the etching resist layer and the first copper foil, further comprising forming at least one laminating structure on the surface of the conductive pattern layer away from the insulating layer.

* * * * *